(12) United States Patent
Inui et al.

(10) Patent No.: US 9,139,380 B2
(45) Date of Patent: Sep. 22, 2015

(54) ARTICLE TRANSPORT FACILITY WITH POSITION-CHANGEABLE LOADING UNIT

(71) Applicant: Daifuku Co., Ltd., Osaka (JP)

(72) Inventors: Yoshitaka Inui, Gamo-gun (JP); Yuichi Morimoto, Komaki (JP); Yuji Baba, Komaki (JP)

(73) Assignee: Daifuku Co., Ltd., Osaka-shi (JP)

( * ) Notice: Subject to any disclaimer, the term of this patent is extended or adjusted under 35 U.S.C. 154(b) by 208 days.

(21) Appl. No.: 13/719,921

(22) Filed: Dec. 19, 2012

(65) Prior Publication Data

US 2014/0003902 A1    Jan. 2, 2014

(30) Foreign Application Priority Data

Dec. 21, 2011    (JP) ................................. 2011-280177

(51) Int. Cl.
| | |
|---|---|
| *B65G 1/04* | (2006.01) |
| *B65G 49/00* | (2006.01) |
| *B61B 3/02* | (2006.01) |
| *H01L 21/677* | (2006.01) |

(52) U.S. Cl.
CPC . *B65G 49/00* (2013.01); *B61B 3/02* (2013.01); *B65G 1/0428* (2013.01); *B65G 1/0457* (2013.01); *H01L 21/6773* (2013.01); *H01L 21/67733* (2013.01); *B65G 2201/0297* (2013.01)

(58) Field of Classification Search
CPC ............................ B65G 1/0457; B65G 1/0428
USPC ........................................ 414/749.1, 589, 541
See application file for complete search history.

(56) References Cited

U.S. PATENT DOCUMENTS

| | | | | |
|---|---|---|---|---|
| 7,676,925 | B2 * | 3/2010 | Kawaguchi et al. | .......... 414/589 |
| 2008/0168920 | A1 | 7/2008 | Nakashima et al. | |

FOREIGN PATENT DOCUMENTS

| | | | | |
|---|---|---|---|---|
| JP | 3197267 | A | | 8/1991 |
| JP | 1045213 | A | | 2/1998 |
| JP | 10045213 | A | * | 2/1998 |
| JP | 200824417 | A | | 2/2008 |
| JP | 2008169005 | A | | 7/2008 |

* cited by examiner

*Primary Examiner* — Gerald McClain
(74) *Attorney, Agent, or Firm* — The Webb Law Firm (57) ABSTRACT

An article transport facility includes a traveling rail hung from a ceiling portion and configured for guiding an article transport carriage, an article loading unit disposed laterally and downwardly of the traveling rail and configured for loading and supporting an article to be transferred to/from the article transport carriage, and a supporting mechanism for supporting the article loading unit hung from the ceiling portion in such a manner that the article loading unit is rendered position-adjustable between a transferring position for transferring the article to/from the article transport carriage and a retracted position retracted upwards from the transferring position. The supporting mechanism is capable of causing the article loading unit loading an article thereon to be position-changeable between the transferring position and the retracted position.

8 Claims, 6 Drawing Sheets

Fig.5

ARTICLE TRANSPORT FACILITY WITH POSITION-CHANGEABLE LOADING UNIT

FIELD OF THE INVENTION

The present invention relates to an article transport facility including a traveling rail hung from a ceiling portion and configured for guiding an article transport carriage, an article loading unit disposed laterally and downwardly of the traveling rail and configured for loading and supporting an article to be transferred to/from the article transport carriage, and a supporting mechanism for supporting the article loading unit hung from the ceiling portion in such a manner that the article loading unit is rendered position-adjustable between a transferring position for transferring the article to/from the article transport carriage and a retracted position retracted upwards from the transferring position.

BACKGROUND

The article transport facility described above is installed in e.g. a cleanroom for transporting a storage container storing therein a substrate such as a silicone substrate as an article.

More particularly, the traveling rail is disposed through/across carry in/out sections of a plurality of substrate processing devices for carrying out a plurality of kinds of processing on a substrate and the article transport carriage transports the article to/from the plurality of substrate processing devices. And, the article loading unit is used for temporarily storing the article in the course of its processing.

Namely, as the article loading unit, a plurality of them can be provided respectively at a plurality of positions of the traveling rail along the length thereof through utilization of space available laterally of the traveling rail. Thus, the arrangement of temporarily storing a mid-processing article, that is, an article in the middle of its processing, in an article loading unit present nearby a substrate processing device to which this article is to be transported next, will be advantageous for improvement of article transporting efficiency. Further, in case no such article loading unit (units) is (are) provided, if a storage unit for storing mid-processing articles is to be provided on a floor surface, this storage unit needs to be large. On the other hand, with provision of the article loading units, omission or down-sizing of such storage unit becomes possible.

Further, in an article transport facility, when the substrate processing devices are to be carried in/out of e.g. a cleanroom for change of layout thereof, the presence of the article loading units can be obstructing, e.g. an article loading unit disposed on the side of the ceiling portion but downwardly of the traveling rail obstructing the transporting of the substrate processing devices. In such case, since the article loading unit can be changed in its position from the transferring position to the retracted position retracted upwards from the transferring position, the obstruction by the article loading unit can be avoided.

Japanese Unexamined Patent Application Publication No. 2008-169005 (Patent Document 1) discloses an example of such article transport facility as described above. The article loading unit provided in this article transport facility is supported to be position-changeable under its no-article loading state, between a transferring position and a retracted position.

Namely, in this Patent Document 1, the article loading unit is hung and supported by a ceiling portion via a link mechanism comprised of a plurality of links connected to be flexible to each other. When the article loading unit is to be positioned at the transferring position, the link mechanism is caused to assume a linearly extended posture. Whereas, when the article loading unit is to be positioned at the retracted position, the link mechanism is caused to assume a flexed posture overlapping the article loading unit from above. Therefore, when the article loading unit is changed in its position from the transferring position to the retracted position, no space for allowing presence of the article is secured upwardly of the article loading unit. As a result, no article can be loaded on the article loading unit when this unit is positioned at the retracted position.

Moreover, in the article transport facility disclosed in Patent Document 1, when the article loading unit is positioned at the retracted position, the spacing between this article loading unit and the ceiling portion becomes smaller than the spacing required for allowing presence of article. In this respect too, when the article loading unit is changed in its position from the transferring position to the retracted position, no space for allowing presence of the article is secured upwardly. As a result, no article can be loaded on the article loading unit when this unit is positioned at the retracted position.

Incidentally, in Patent Document 1, there is described as a further embodiment using a slide mechanism vertically slidable for position-changing the article loading unit between the transferring position and the retracted position. However, even with use of such slide mechanism, when the article loading unit is positioned at the retracted position, the spacing between this article loading unit and the ceiling portion becomes smaller than the spacing required for allowing presence of article. Thus, no article can be loaded on the article loading unit when this unit is positioned at the retracted position.

When there arises a need to retract an article loading unit from the transferring position to the retracted position, it may be that this article loading unit is currently loading an article thereon. In such case, in the case of the conventional article transport facility, it is necessary to first remove manually the article from the article loading unit and then to change the position of the article loading unit to the retracted position. Therefore, the operation for position-changing the article loading unit between the transferring position and the retracted position is troublesome.

Furthermore, after the article loading unit has been returned from the retracted position to the transferring position, it is necessary to manually return the once-removed article back to the same previous state. Hence, in this respect too, the operation for position-changing the article loading unit between the transferring position and the retracted position is troublesome.

Meanwhile, the positions of articles to be transported are managed by a managing means for managing the article transport facility. Therefore, when a once-removed article is manually retuned to the article loading unit, it is necessary to return it accurately to the same position as the position thereof prior to the removal.

However, in such a situation when a plurality of article loading units are simultaneously retracted to the retracted positions, there can occur an error that the position to which the removed article is to be returned differs from the previous one, so that appropriate position management of the transported articles becomes impossible.

SUMMARY OF THE INVENTION

In view of the above-described state of the art, there is a need for realizing an article transport facility that can simplify the operation of position-changing an article loading unit loading an article thereon between the transferring position and the retracted position.

An article transport facility according to the present invention comprises:

a traveling rail hung from a ceiling portion and configured for guiding an article transport carriage;

an article loading unit disposed laterally and downwardly of the traveling rail and configured for loading and supporting an article to be transferred to/from the article transport carriage; and a supporting mechanism for supporting the article loading unit hung from the ceiling portion in such a manner that the article loading unit is rendered position-adjustable between a transferring position for transferring the article to/from the article transport carriage and a retracted position retracted upwards from the transferring position;

wherein the supporting mechanism is capable of causing the article loading unit loading an article thereon to be position-changeable between the transferring position and the retracted position.

That is, the article loading unit is supported to be position-changeable under the state thereof loading an article thereon, between the transferring position and the retracted position. Therefore, when an article loading unit is to be moved from the transferring position to the retracted position, even if this article loading unit is currently loading an article thereon, the article loading unit can be moved as it is from the transferring position to the retracted position and conversely the article loading unit can be returned as it is from the retracted position to the transferring position.

Incidentally, the above-described situation when an article loading unit loading an article thereon is position-changeable between the transferring position and the retracted position means a situation in the course of position change of the article loading unit from the transferring position to the retracted position as well as a situation when at the retracted position, the article loading unit is maintained under the posture loading an article thereon and a space for allowing presence of the article is secured upwardly of the article loading unit.

In this way, when an article loading unit is to be position-changed from the transferring position to the retracted position, even if this article loading unit is currently loading an article thereon, the article loading unit as it is can be moved from the transferring position to the retracted position and also the article loading unit can be returned as it is from the retracted position to the transferring position. Therefore, the operation for position-changing the article loading unit between the transferring position and the retracted position can be simplified.

In short, with the above-described configuration, it has become possible to provide an article transport facility that can simplify the operation of position-changing an article loading unit loading an article thereon between the transferring position and the retracted position.

DETAILED DESCRIPTION

Next, embodiments of the present invention will be described with reference to the accompanying drawings.

Figure 1:
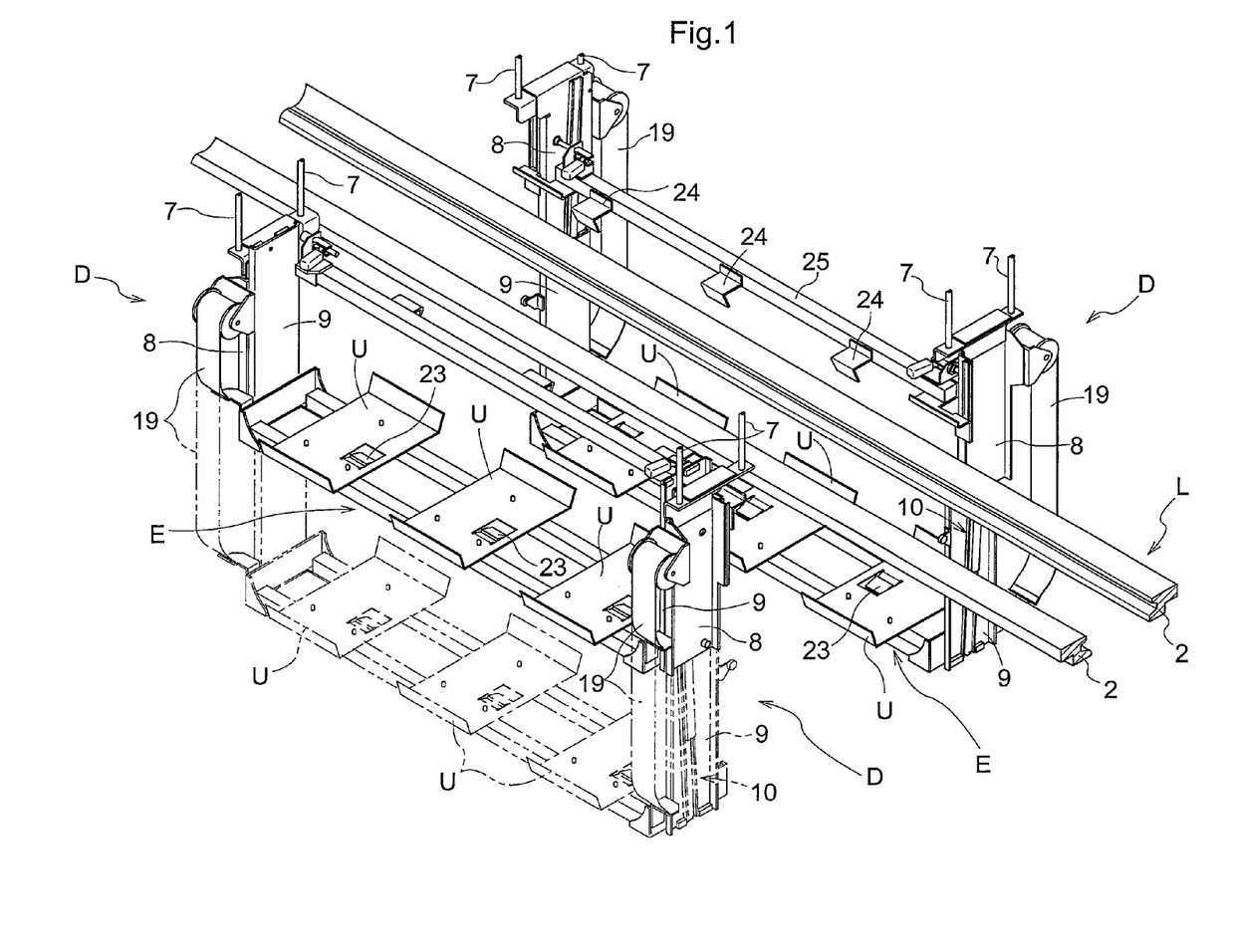
FIG. 1 is a perspective view showing an article transport facility.
Figure 2:
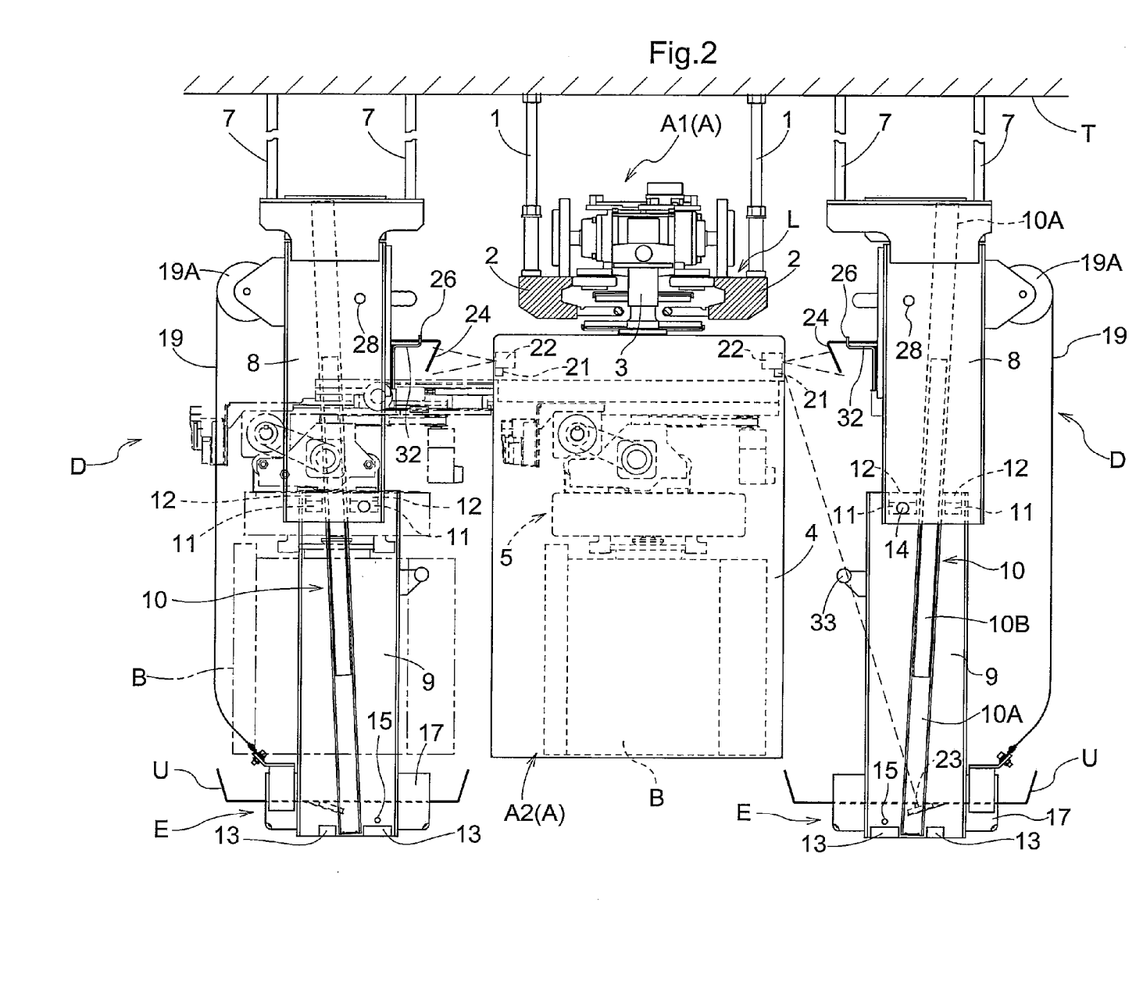
FIG. 2 is a front view of the article transport facility.

As shown in FIG. 1 and FIG. 2, a traveling rail L for guiding an article transport carriage A is installed to be hung and supported from a ceiling portion T. Laterally and downwardly of the traveling rail L, article loading units U loading and supporting articles B to be transferred to/from the article transport carriage A are hung and supported from/by the ceiling portion T. In the instant embodiment, the article loading units U are provided on the both opposed lateral sides of the traveling rail L. The article transport carriage A is configured to transfer an article B to be transported to an article loading unit U for its storage and also to retrieve the article B stored in/on the article loading unit U and transport it. These components, i.e. the traveling rail L, the article loading units U, and the article transport carriage A together constitute what is referred to herein as an "article transport facility".

The article transport facility of this embodiment is configured as a facility for transporting storage containers (Front Opening Unified Pods or "FOUP's" for short) storing substrates such as silicon substrates, as "articles B" in a cleanroom. Though not shown, the traveling rail L is laid to extend through/across article carry in/out sections of a plurality of substrate processing devices; and the article transport carriage A is configured to transport the articles B to/from the plurality of substrate processing devices. And, each article loading unit U is configured to temporarily store an article B therein.

The traveling rail L is installed as being hung from the ceiling portion T via a rail support 1.

In the instant embodiment, the traveling rail L includes a pair of right and left traveling rail portions 2 spaced apart from each other along the right/left direction; and the pair of right and left traveling rail portions 2 are installed as being hung from the ceiling portion T via the rail support 1. Here, the language "right/left direction" refers to the horizontal direction orthogonal to the longitudinal direction of the traveling rail L.

The article transport carriage A, as shown in FIG. 2, includes a traveling portion A1 which travels on the traveling rail L and a carriage main body portion A2 disposed downwardly of the traveling rail L. The carriage main body portion A2 is supported by and suspended from the traveling portion A1 via a connecting shaft 3 disposed between the pair of right and left traveling rail portions 2.

The carriage main body portion A2 includes a gripping portion 5 disposed at an upper portion of a cover unit 4 having a reverse U-shape as seen in the side view thereof, the gripping portion 5 being configured to grip the article B under a suspended condition. Further, this gripping portion 5 can be driven to be lifted up/down and also to slide laterally along the lateral direction. With these lifting movement and the lateral sliding movement of the gripping portion 5, the article transport carriage A transfers the article B to/from article loading units U or to/from article carry in/out sections of the substrate processing devices.

Next, further explanation will be made on transfers of an article B to/from the article loading unit U. In case an article B is to be transferred to an article loading unit U, the gripping portion 5 which grips this article B is caused to slide to the laterally outer side and also lowered, after which the gripping of the article B is released. Thereafter, the gripping portion 5 is elevated and slid to the laterally inner side, thereby to return the gripping portion 5 to the position inside the cover unit 4.

Conversely, in case an article B is to be received from the article loading unit U, the gripping portion 5 is caused to slide to the laterally outer side and also lowered, after which the gripping portion 5 is caused to grip the article B. Thereafter, this gripping portion 5 gripping the article B is elevated and also slid to the inner side of the carriage, thereby to return the gripping portion 5 to the position inside the cover unit 4.

Figure 3:
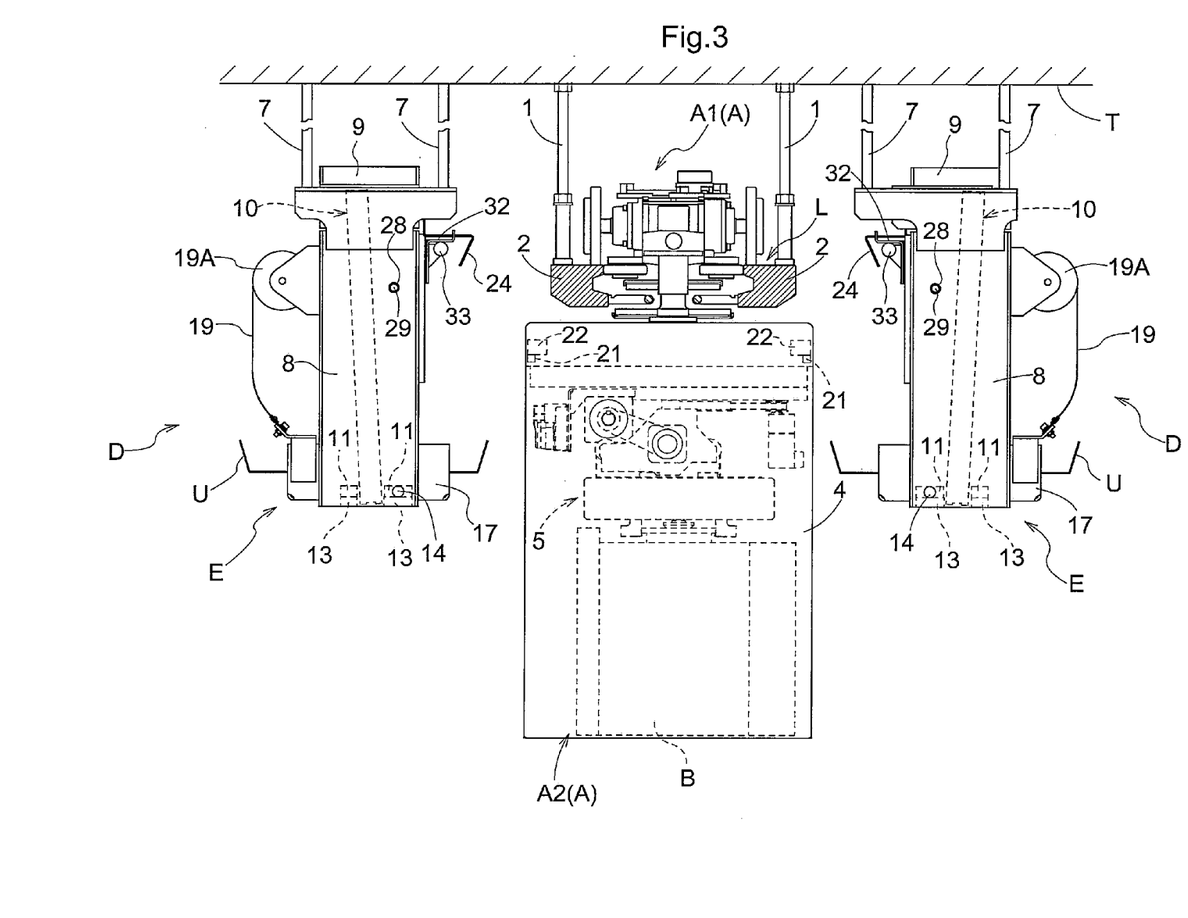
FIG. 3 is a front view showing a condition when an article loading deck has been retracted.

The article loading unit U is supported to be position-adjustable between a transferring position for transferring/retrieving an article B to/from the article transport carriage A (see FIG. 2) and a retracted position retracted upwards from the transferring position (see FIG. 3). The retracted position is set at a position evading contact with the article transport carriage A traveling on the traveling rail 1 and/or the article B being transported by this article transport carriage A. Therefore, under the situation of the article loading unit U being located at the retracted position, when the article transport carriage A is caused to travel to e.g. a retracted area not interfering with a changing operation for changing the layout, it is possible to cause the article transport carriage A to travel smoothly without coming into contact with the article loading unit U located at the retracted position. In the instant embodiment, the transferring position too is set at a position evading contact with the article transport carriage A traveling on the traveling rail 1 and/or the article B being transported by this article transport carriage A.

Further, in the instant embodiment, a supporting mechanism D for supporting the article loading unit U as being hung from the ceiling portion T is configured to support the article loading unit U with allowing the article loading unit U loading an article B thereon being position-changeable between the transferring position and the retracted position. Moreover, the supporting mechanism D is configured also to support the article loading unit U, with the retracting position, as compared with the transferring position, being spaced apart more toward the lateral side of the traveling rail L. More particularly, the retracted position is set at a position which is more upward than the transferring position and where a lateral separation distance from the traveling rail L (the distance between the article loading unit U and the traveling rail L along the horizontal direction) is longer than that of the transferring position. Further, the retracted position is set at a position which is lower than the ceiling portion T and where the distance between the article loading unit U and the ceiling portion T is greater than the height of the article B.

In the instant embodiment, the article transport carriage A is configured to transport the article B with supporting this article B upwardly of the article loading unit U located at the transferring position. Therefore, it is possible to dispose the article loading unit U, as seen in the plane view, at the transferring position closer to or projecting into the space where the article transport carriage A passes. As a result, in transferring the article B, it is possible to reduce the amount of movement of this article B along the lateral width of the traveling rail L, so that the transfer of the article B can be carried out in an efficient manner.

Figure 4:
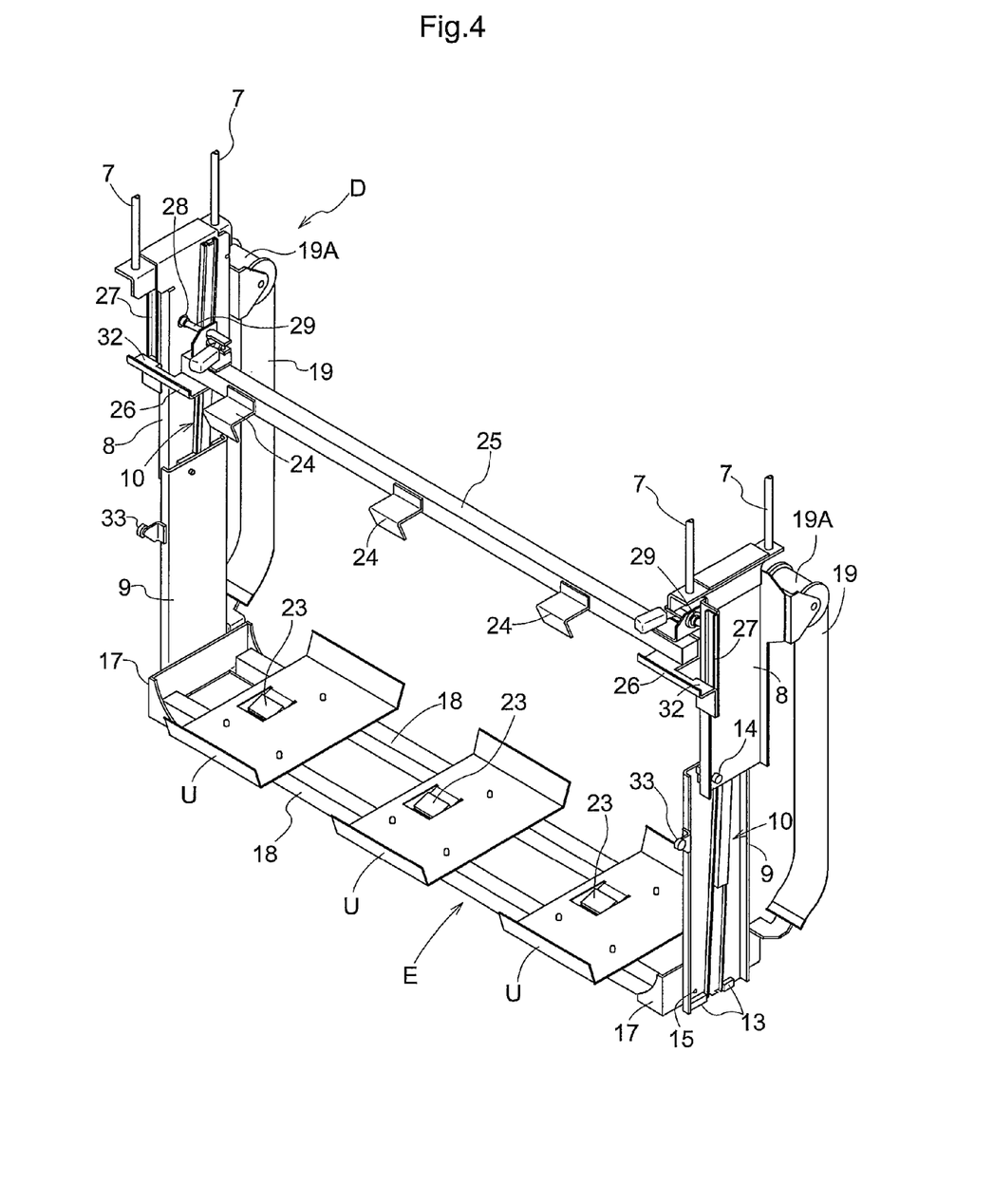
FIG. 4 is a perspective view showing a mounting portion of the article loading deck.

Next, some additional explanation will be given on the supporting mechanism D. As shown in FIG. 4, there are provided a pair of right and left upper frames 8 which are supported by and hung from the ceiling portion T via hanging supports 7. Relative to each one of the pair of right and left upper frames 8, a lower frame 9 is guided to be movable up/down by means of a sliding type rail mechanism 10. The right and left upper frames 8 are disposed in spaced juxtaposition along the right/left direction. Here, the language "right/left direction" refers to the horizontal direction parallel with the longitudinal direction of the traveling rail L.

And, as shown in FIG. 2 and FIG. 3, the sliding type rail mechanism 10 is disposed with an inclined posture such that as the mechanism 10 extends upwards, it extends more laterally outward relative to the traveling rail L. Thus, the lower frame 9 is guided by the rail mechanism 10 such that as the lower frame 9 moves upward, the lateral separation distance from the traveling rail L progressively increases. In this way, in the instant embodiment, the supporting mechanism D includes the upper frames 8, the lower frame 9 and the rail mechanism 10. With the arrangement that the supporting mechanism D slidably supports the article loading unit U in such a manner that as the unit U is elevated from the transferring position to the retracted position, the lateral separation distance from the traveling rail L increases progressively, the position change of the article loading unit U between the transferring position and the retracted position can be effected by the simple operation involving only the linear sliding movement of the article loading unit U. As a result, the moving operations of the article loading unit U can be simplified.

The rail mechanism 10 includes at least two rails. In the instant embodiment, the rail mechanism 10 consists of three rails, i.e. fixed rails 10A attached to the upper frames 8 and the lower frame 9 respectively and an intermediate rail 10B that connects the fixed rails 10A with allowing slidable movement therebetween.

Figure 5:
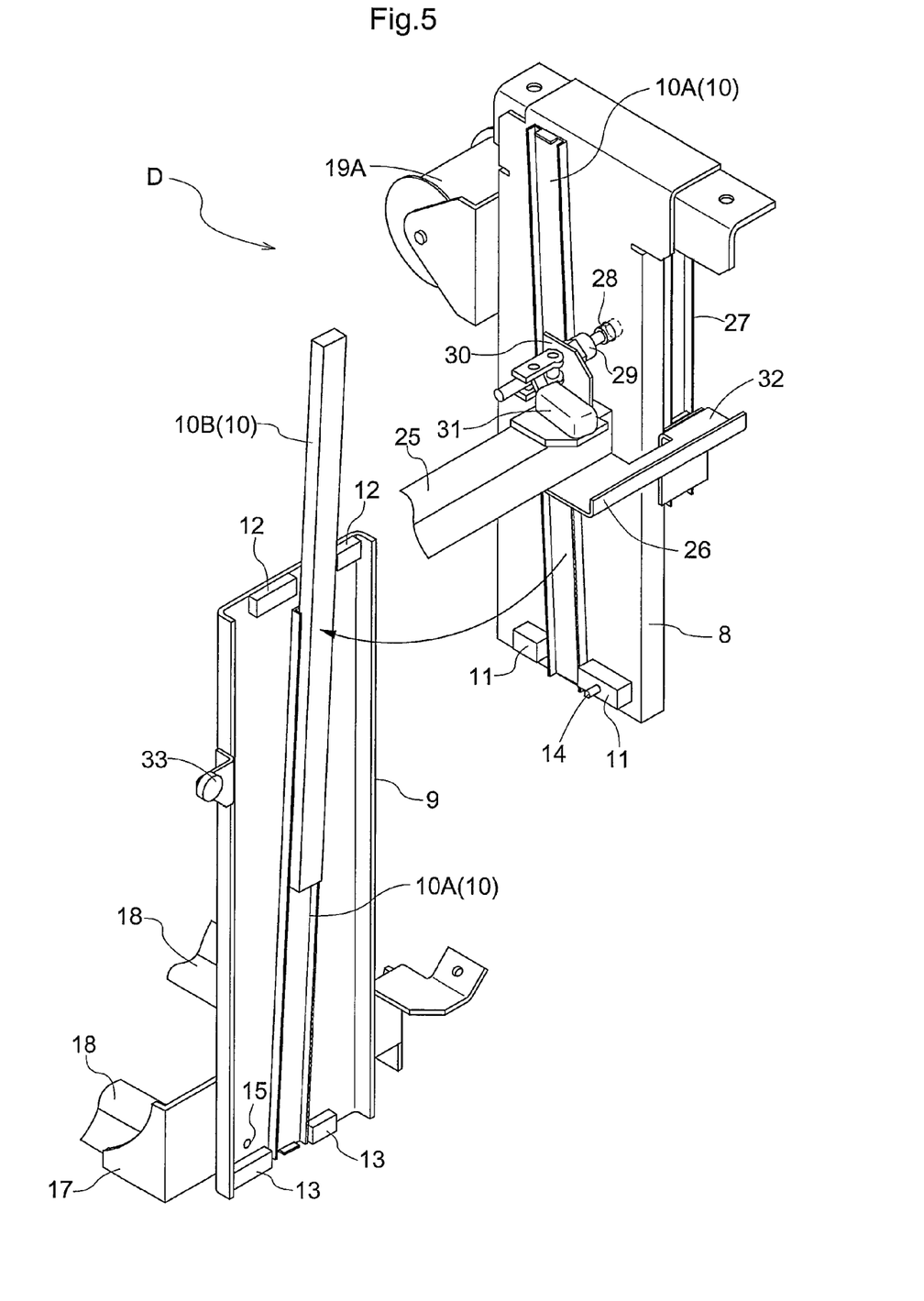
FIG. 5 is an exploded perspective view showing a supporting mechanism for the article loading deck.

As shown in FIG. 5, as the lower end of the upper frame 8, there are provided a pair of upper frame side contact members 11. And, at the upper end of the lower frame 9, there are provided a pair of lowering limit restricting contact members 12 that come into contact with the upper frame side contact members 11 for restricting the lowering range of the lower frame 9. Further, at the lower end of the lower frame 9, there are provided a pair of elevating limit restricting contact members 13 that come into contact with upper frame side contact members 11 for restricting the elevating range of the lower frame 9. Thus, with these contact members 11, 12, 13, the elevating and lower ranges of the lower frame 9 relative to the upper frames 8 are restricted.

And, as shown in FIG. 2, when the lower frame 9 is positioned at its lowering limit, that is, when the lowering limit restricting contact members 12 are placed in contact with the upper frame side contact members 11, the article loading unit U is set at the transferring position. As shown in FIG. 3, when the lower frame 9 is positioned at its elevating limit, that is, when the elevating limit restricting contact members 13 are placed in contact with the upper frame side contact members 11, the article loading unit U is set at the retracted position.

Incidentally, as shown in FIG. 4 and FIG. 5, when the article loading unit U is to be maintained at the retracted position, a positioning pin 14 movably threaded to one upper frame side contact member 11 of the pair of upper frame side contact members 11 will be brought into engagement in a positioning hole 15 defined in the lower frame 9, thereby to restrict the lowering movement of the lower frame 9.

In the instant embodiment, as shown in FIG. 1 and FIG. 4, a plurality (specifically, three) of article loading units U are mounted on an article loading deck E in juxtaposition along the longitudinal direction of the traveling rail L; and at each one of opposed ends of this article loading deck E, the aforementioned lower frame 9 is attached to project upward therefrom. Therefore, the plurality of article loading units U can be position-changed at a time altogether (that is, with a single action) between the transferring position and the retracted position.

Specifically, at the lower end of each one of the pair of right and left lower frames 9, a receiver frame 17 is bolt-connected, and a pair of elongate frames 18 extending along the longitudinal direction of the traveling rail L are disposed in juxtaposition along the lateral width of the traveling rail L and have their opposed ends placed on and supported to the receiver frame 17. Thus, the article loading deck E is constituted with the pair of elongate frames 18 as its principal component.

And, the three article loading units U, as being mounted and supported on the pair of elongate frames 18, are juxtaposed along the longitudinal direction of the traveling rail L.

The article loading unit U, as loading an article B thereon, is supported to be position-changeable between the transferring position and the retracted position. In this regard, in the instant embodiment, since the opposed ends of the elongate article loading deck E extending along the longitudinal direction of the traveling rail L are supported to be movable up/down, the posture of the plurality of article loading units U mounted on this article loading deck E can be stable, so that it is possible to avoid disturbance of the posture of the articles B mounted and supported on the article loading units U in the course of position change of the article loading unit U between the transferring position and the retracted position. And, the supporting mechanism D is disposed at a position not overlapped, when viewed from the above, with the article loading unit U movable between the transferring position and the retracted position. More particularly, each one of the upper frames 8, the lower frame 9 and the rail mechanism 10 included in the supporting mechanism D is set at a position different from that of the article loading unit U relative to the longitudinal direction of the traveling rail L. Further, as described above, the retracted position is set at a position which is lower than the ceiling portion T and the distance between the article loading unit U and the ceiling portion T is greater than the height of the article B. Accordingly, when the article loading unit U is located at the retracted position too, there can be secured a space that allows presence of the article B upwardly of each article loading unit U. In this way, the supporting mechanism D is configured to support the article loading unit U, with allowing the article loading unit U loading an article B thereon to be position-changeable between the transferring position and the retracted position.

As shown in FIG. 1 and FIG. 4, between the upper frame 8 and the lower frame 9, there is disposed a Conston spring 19 with its take-up portion 19A being located in the upper frame 8.

Therefore, the elevating and lowering operations of the article loading deck E including the three article loading units U can be effected lightly with a small operation force.

The article transport carriage A mounts an article presence/absence detection sensor 21 for detecting whether an article B is present on the article loading unit U or not and an ID information detection sensor 22 for detecting ID information of each article loading unit U.

The article presence/absence detection sensor 21 is constituted by using a reflection type light sensor configured to detect a light reflector 23 provided at a loading face corresponding portion of each article loading unit U.

The ID information detection sensor 22 is configured to detect ID information (e.g. a two-dimensional code) indicated by an indicator member 24 provided at a position upwardly distant from each article loading unit U.

Namely, the article transport carriage A is configured such that when an article B is transferred to each article loading unit U, the ID information indicated by the indicator member 24 is detected by the ID information detection sensor 22, thereby to check whether this article loading unit U is the target for transferring the article B thereto. Further, the article transport carriage A is configured also to check whether an article B is loaded on the transfer-target article loading unit U or not, based on the information obtained by the article presence/absence detection sensor 21.

The indicator member 24 is configured to be position-changeable between a detectable position and a non-detectable position in association with position change of the article loading unit U such that this indicator member 24 is set at the detectable position detectable by the ID information detection sensor 22 when the article loading unit U is located at the transferring position whereas the indicator member 24 is set at the non-detectable position not detectable by the ID information detection sensor 22 when the article loading unit U is located at the retracted position. In the instant embodiment, such operative association or interlocking between the position of the indicator member 24 and the position of the article loading unit U is realized by an interlocking mechanism M.

More particularly, as shown in FIG. 1 and FIG. 4, there is provided an elongate support frame 25 supporting the three indicator members 24 corresponding to the three article loading units U. And, a pair of receiver members 26 receiving and supporting the opposed ends of the support frame 25 are supported by guide rails 27 provided respectively in the pair of upper frames 8 to be vertically movable via them within a predetermined range so as to position-change each indicator member 24 between the detectable position and the non-detectable position.

As shown in FIG. 5, a lock pin 29 is slidably supported to a support bracket 30 which is connected to the support frame 25. The lock pin 29 comes into engagement into a positioning hole 28 defined in the upper frame 8 when the receiver member 26 is located at the lowermost position within the lifting range. Further, the support bracket 30 mounts a pivot lever 31 for sliding the lock pin 29.

That is, when the receiver member 26 is located at the lowermost position within the lifting range, the indicator member 24 is located at the detectable position. In this, as the lock pin 29 is engaged within the positioning hole 28, the indicator member 24 can be maintained at this detectable position.

Further, as shown in FIG. 3 and FIG. 5, in the lower frame 9, there is provided a pressing member 33. In the course of movement of the article loading unit U from the transferring position to the retracted position, the pressing member 33 presses a contacted member 32 formed by a portion of the receiver member 26 thereby to elevate the receiver member 26. When the lower frame 9 is elevated in order to move the article loading unit U from the transferring position to the retracted position, the support frame 25 supporting the indicator members 24 is elevated. As described above, in the instant embodiment, the interlocking mechanism M includes the receiver members 26, the guide rail 27, and the pressing member 33.

That is, when the lower frame 9 is elevated to the uppermost position in order to move the article loading unit U from the transferring position to the retracted position, the indicator member 24 is set to the non-detectable position. And, as described above, the lower frame 9 elevated to the uppermost position is maintained by the positioning pin 14, thereby to restrict lowering of the lower frame 9, whereby the indicator member 24 is maintained at this non-detectable position.

Therefore, the indicator member 24 is elevated from the detectable position to the non-detectable position in association with elevation of the lower frame 9 to the uppermost position for moving the article loading unit U from the transferring position to the retracted position. Conversely, the indicator member 24 is lowered to the detectable position in association with lowering of the lower frame 9 for moving the article loading unit U from the retracted position to the transferring position.

Incidentally, when the lower frame 9 is elevated to the uppermost position in order to move the article loading unit U from the transferring position to the retracted position, the lock pin 29 will be removed from the positioning hole 28. Also, after the lower frame 9 is lowered in order to move the article loading unit U from the retracted position to the transferring position, the lock pin 29 will be engaged into the positioning hole 28.

As described above, with the article transport facility according to the instant embodiment, as the article loading unit U is supported to be position-changeable between the transferring position and the retracted position, when a substrate processing device is carried in/out for e.g. change of the layout, with position changing of the article loading unit U to the retracted position, it is possible to avoid interference of the transport of the substrate processing device by the article loading unit U.

And, since the article loading unit U as loading an article B thereon is supported to be position-changeable between the transferring position and the retracted position, even when the article loading unit U is loading an article B thereon, this article loading unit U can be position-changed to the retracted position without the trouble of removing the article B therefrom.

Moreover, in operative association with the position change of the article loading unit U between the transferring position and the retracted position, the indicator member 24 indicating the ID information of the article loading unit U is position-changed between the detectable position and the non-detectable position. Accordingly, when the article loading unit U is located at the transferring position, it is possible to check whether this article loading unit U is the transfer-target article loading unit or not, based on the ID information detected by the ID information detection sensor 22. Conversely, when the article loading unit U is located at the retracted position, it can be determined that the transfer-target article loading unit U is not present, so that erroneous transfer of the article B can be prevented. Namely, if one forgot to return the article loading unit U from the retracted position to the transferring position and then transport of the article B by the article transport carriage A is resumed, the article transport carriage A may erroneously effect transfer of the article B to this article loading unit U located at the retracted position. The above arrangement can effectively avoid such erroneous transfer operation.

OTHER EMBODIMENTS

Next, other embodiments of the invention will be described respectively.

(1) In the foregoing embodiment, there was shown an arrangement for lifting up/down the article loading deck E with retaining the lower frame 9 to the upper frame 8 with using the Conston spring 19. Instead, a further arrangement shown in FIG. 6 may be embodied. In this, a string-like member 36 paid out along the horizontal direction from a manual winding pulley 35 mounted to the ceiling portion T is guided downward by a free rotation pulley 37 also mounted to the ceiling portion T and its terminal end is connected to the lower frame 9, so that with a rotational operation of the manual winding pulley 35, the article mounting deck E is lifted up/down.

Figure 6:
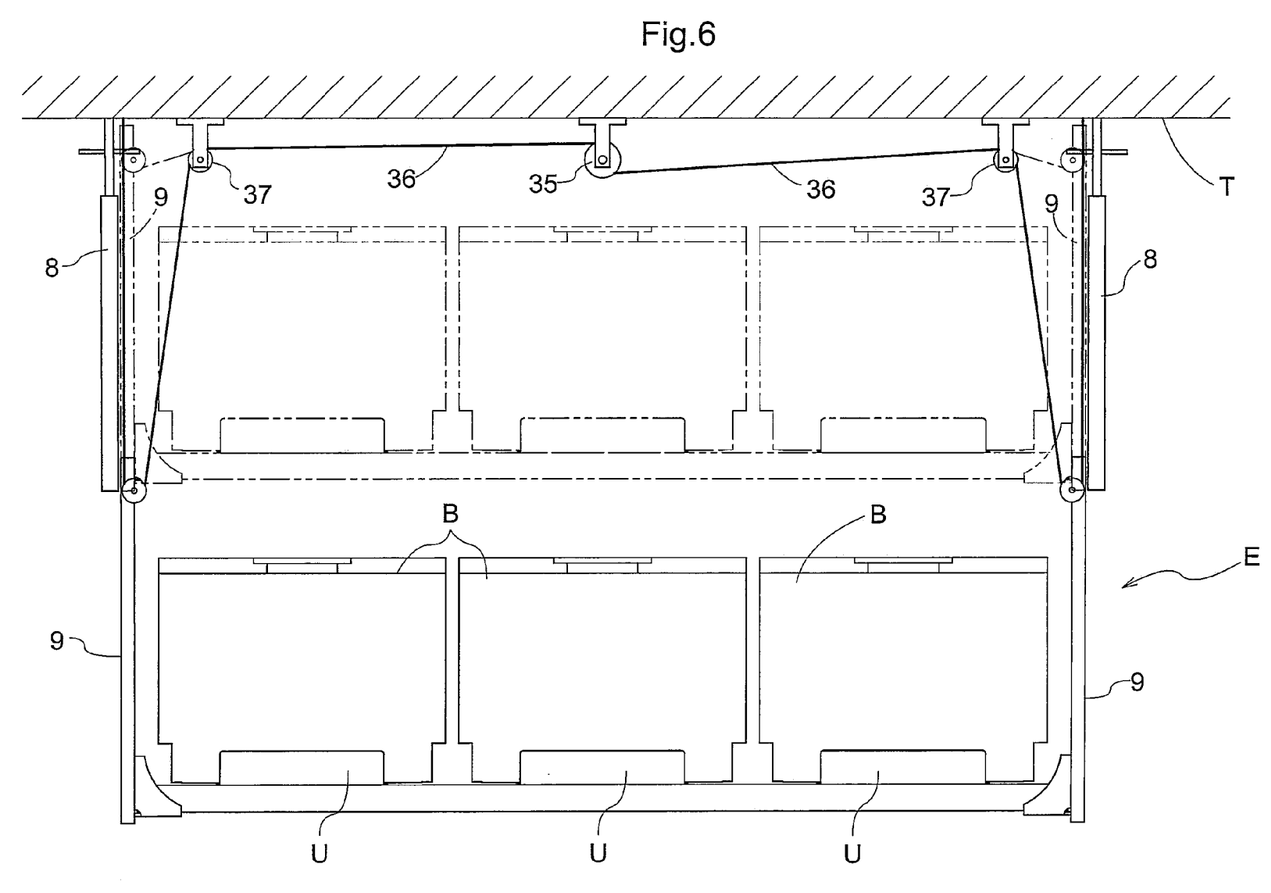
FIG. 6 is a front view relating to a further embodiment.

That is, since the manual winding pulley 35 can be rotatably operated with a small operational force with use of a crank bar or the like, the lifting operations of the article loading deck E having the three article loading units U can be lifted up/down in a favorable manner.

(2) In the foregoing embodiment, there was shown the arrangement wherein the article loading deck E extending along the longitudinal direction of the traveling rail L mounts three article loading units U. Instead, the article loading deck E may mount only two or more than four article loading units U. Further alternatively, each article loading unit U may be supported to be position-changeable, with total omission of such article loading deck E.

(3) In the foregoing embodiment, there was shown the arrangement wherein the article loading units U are provided on both the opposed lateral sides of the traveling rail L. However, the disposing arrangements of the article loading units U relative to the traveling rail L can vary in many ways, such as an arrangement of providing the article loading units U only on one lateral side of the traveling rail L.

(4) In the foregoing embodiment, storage containers (FOUP) accommodating substrates were disclosed as an example of the articles B. However, the article transport facility according to the present invention is usable for transport of various kinds of articles. Hence, the specific configuration of the article transport carriage A may vary in many ways, in accordance with the type of article to be transported.

DESCRIPTION OF REFERENCE MARKS/NUMERALS 8 upper frame
9 lower frame
10 sliding rail mechanism
22 ID information detection sensor
24 indicator member
A article transport carriage
D supporting mechanism
E article loading deck
L traveling rail
M interlocking mechanism
T ceiling portion
U article loading unit

The invention claimed is:

1. An article transport facility comprising:
a traveling rail hung from a ceiling portion and configured for guiding an article transport carriage;
an article loading unit disposed laterally and downwardly of the traveling rail and configured for loading and supporting an article to be transferred to and from the article transport carriage; and
a supporting mechanism for supporting the article loading unit hung from the ceiling portion in such a manner that the article loading unit is rendered position-adjustable between a transferring position for transferring the article to and from the article transport carriage and a retracted position retracted upwards from the transferring position;
wherein the supporting mechanism is capable of causing the article loading unit loading an article thereon to be position-changeable between the transferring position and the retracted position,
wherein the transferring position is defined laterally and downwardly of the traveling rail for transferring or retrieving the article to and from the article transport carriage, and wherein the retracted position is retracted upward from the transferring position laterally and at least partially above the traveling rail.

2. The article transport facility according to claim 1, wherein the supporting mechanism supports the article loading unit such that the lateral separation distance from the traveling rail is longer at the retracted position than at the transferring position so as to avoid contact interference between the article loading unit located at the retracted position and the article transport carriage traveling on the traveling rail.

3. The article transport facility according to claim 2, wherein the supporting mechanism slidably supports the article loading unit such that the lateral separation distance from the traveling rail increases progressively in association with elevation from the transferring position to the retracted position.

4. The article transport facility according to claim 3, wherein:
 on an elongate article loading deck extending along the longitudinal direction of the traveling rail, a plurality of said article loading units are juxtaposed along the longitudinal direction of the traveling rail;
 at each one of opposed ends of the article loading deck along the longitudinal direction of the traveling rail, there is provided a lower frame projecting upwards; and
 the supporting mechanism includes a sliding rail mechanism for guiding and lifting each one of the pair of lower frames up and down relative to an upper frame supported by and hung from the ceiling portion, and the sliding rail mechanism guides the lower frame relative to the upper frame such that the lateral separation distance from the traveling rail progressively increases in association with the elevation.

5. The article transport facility according to claim 1, further comprising:
 an interlocking mechanism for changing the position of an indicator member indicating ID information of the article loading unit in operative association with the position change of the article loading unit, between a detectable position detectable by an ID information detection sensor mounted on the article transport carriage and a non-detectable position not detectable by the ID information sensor; and
 said interlocking mechanism interlocks the position of the indicator member with the position of the article loading unit such that the indicator member is set at the detectable position when the article loading unit is located at the transferring position whereas the indicator member is set at the non-detectable position when the article loading unit is located at the retracted position.

6. The article transport facility according to claim 1, wherein:
 said retracted position is set at a position where the distance between the article loading unit located at the retracted position and the ceiling portion is greater than the height of the article; and
 said supporting mechanism is disposed at a position not overlapped as seen from the above with the article loading unit movable between the transferring position and the retracted position.

7. The article transport facility according to claim 1, further comprising:
 an article loading deck receiving the article loading unit;
 an upper frame supported by and hung from the ceiling portion; and
 a lower frame projecting upwards from the article loading deck,
 wherein the support mechanism includes a sliding rail mechanism for moving the lower frame horizontally along the upper frame to linearly raise or lower the article loading deck.

8. An article transport facility comprising:
 a traveling rail hung from a ceiling portion and configured for guiding an article transport carriage;
 an article loading unit disposed laterally and downwardly of the traveling rail and configured for loading and supporting an article to be transferred to and from the article transport carriage; and
 a supporting mechanism for supporting the article loading unit hung from the ceiling portion in such a manner that the article loading unit is rendered position-adjustable between a transferring position for transferring the article to and from the article transport carriage and a retracted position retracted upwards from the transferring position;
 wherein the supporting mechanism is capable of causing the article loading unit loading an article thereon to be position-changeable between the transferring position and the retracted position,
 wherein the supporting mechanism supports the article loading unit such that the lateral separation distance from the traveling rail is longer at the retracted position than at the transferring position so as to avoid contact interference between the article loading unit located at the retracted position and the article transport carriage traveling on the traveling rail,
 wherein the supporting mechanism slidably supports the article loading unit such that the lateral separation distance from the traveling rail increases progressively in association with elevation from the transferring position to the retracted position,
 wherein the article loading unit maintains a relative angle with respect to the supporting mechanism during said sliding support.

\* \* \* \* \*

UNITED STATES PATENT AND TRADEMARK OFFICE
CERTIFICATE OF CORRECTION

| | | |
|---|---|---|
| PATENT NO. | : 9,139,380 B2 | Page 1 of 1 |
| APPLICATION NO. | : 13/719921 | |
| DATED | : September 22, 2015 | |
| INVENTOR(S) | : Yoshitaka Inui et al. | |

It is certified that error appears in the above-identified patent and that said Letters Patent is hereby corrected as shown below:

IN THE CLAIMS

Column 12, Line 6, Claim 6, delete "from the" and insert -- from --

Signed and Sealed this
Sixteenth Day of February, 2016

Michelle K. Lee
*Director of the United States Patent and Trademark Office*